United States Patent [19]
Tanaka et al.

[11] Patent Number: 5,827,080
[45] Date of Patent: Oct. 27, 1998

[54] ROTARY SECTION CURRENT TRANSMITTING MECHANISM

[75] Inventors: Yoshihiro Tanaka; Takashi Nogami, both of Kyoto, Japan

[73] Assignee: Nissin Electric Co., Ltd., Kyoto, Japan

[21] Appl. No.: 662,510

[22] Filed: Jun. 13, 1996

[30] Foreign Application Priority Data

Jun. 13, 1995 [JP] Japan .................................. 7-146518

[51] Int. Cl.⁶ .................................................. H01R 3/00
[52] U.S. Cl. ........................................................ 439/164
[58] Field of Search ...................................... 439/164, 15

[56] References Cited

U.S. PATENT DOCUMENTS

| | | | |
|---|---|---|---|
| 4,607,898 | 8/1986 | Reighard et al. | 439/15 |
| 4,838,803 | 6/1989 | Kondo | 439/164 |
| 5,046,951 | 9/1991 | Suzuki | 439/15 |
| 5,049,082 | 9/1991 | Carter | 439/15 |
| 5,100,331 | 3/1992 | Banfelder | 439/15 |
| 5,219,460 | 6/1993 | Kato et al. | 439/164 |
| 5,286,219 | 2/1994 | Ueno et al. | 439/164 |

FOREIGN PATENT DOCUMENTS

| | | |
|---|---|---|
| 57-104688 | 6/1982 | Japan . |
| 1-208494 | 8/1989 | Japan . |
| 1-305533 | 12/1989 | Japan . |
| 4-180599 | 6/1992 | Japan . |
| 5-326671 | 12/1993 | Japan . |
| 3-102814 | 4/1994 | Japan . |

*Primary Examiner*—P. Austin Bradley
*Assistant Examiner*—T. C. Patel

[57] ABSTRACT

A rotary section current transmitting mechanism includes a rotary member having an outer wall of a circular cross-section and a stationary member provided around the rotary member with separation from the rotary member by ring-shaped space so as to form concentric circles with the rotary member, and having an inner wall of a circular cross-section. The ring-shaped space accommodates a film-shaped wire. Both ends of the film-shaped wire are fixed in the same direction respectively to wire fixing sections of the rotary member and of the stationary member, and the film-shaped wire curves between the both ends. The film-shaped wire has a configuration in which conductors are sandwiched between insulating films. This configuration enables electric current to be stably transmitted from the stationary member to the rotary member which rotates forward and backward within a predetermined angle.

58 Claims, 10 Drawing Sheets

ROTARY SECTION CURRENT TRANSMITTING MECHANISM

FIELD OF THE INVENTION

The present invention relates to a rotary section current transmitting mechanism for transmitting current between an inner member and an outer member which rotates forward and backward within a limited angle relatively to the inner member. The rotary section current transmitting mechanism is applicable to a semiconductor manufacturing machine, such as an ion implantation machine, an industrial robot, and so on.

BACKGROUND OF THE INVENTION

Conventionally, slip rings have been used for providing electric power to rotary members in semiconductor manufacturing machines and industrial robots. The slip ring is mainly composed of a sliding ring and a brush. Electric wire, as well as such a slip ring, is sometimes used for a rotary member rotating forward and backward within a predetermined angle. The wire is designed to be of such a length as to follow the rotary member in any position during the rotation, and is slack when the rotary member is in certain positions.

Nonetheless when the slip ring is used for providing electric power to the rotary member, the sliding ring and the brush abrade, which causes various problems such as dust, inadequate contact, and noise. As a result, such a slip ring is not very reliable, needs frequent maintenance, and wears out easily. Especially, in the semiconductor manufacturing machine, reduction of dust and noise which affects its control system is strongly demanded.

Besides, the wire in the above configuration may cut off and tangle, and is therefore not very reliable and not applicable for a wide rotation angle.

SUMMARY OF THE INVENTION

In view of the above problems, it is an object of the present invention to provide a rotary section current transmitting mechanism which is dust free, highly reliable, lasting and almost maintenance free.

To achieve the above object, a rotary section current transmitting mechanism in accordance with the present invention includes:

an inner member having an outer wall whose cross-sectional shape is circular;

an outer member provided around the inner member with separation from the inner member by ring-shaped space so as to form concentric circles with the inner member, and having an inner wall whose cross-sectional shape is circular; and a flexible belt accommodated in the ring-shaped space, the belt curving between both ends which are fixed in the same direction respectively to the outer wall of the inner member and to the inner wall of the outer member, wherein at least one of the inner and outer members is provided so as to be capable of rotating forward and backward within a limited angle, and the belt has at least one conductor provided on a film-shaped insulating material that serves as a base.

Note that the belt may have at least one conductor provided in a film-shaped insulating material.

According to the above arrangement, if the relative angle between the inner member and the outer member changes within a predetermined range, for example, due to rotation of the inner member in a certain direction, the belt is wound around the outer wall of the inner member. If the inner member rotates in the other direction, the belt is stretched along the inner wall of the outer member. The ring-shaped space between the inner member and the outer member serves during rotation in any direction as a guide for preventing the belt from being rubbed or broken. Consequently, the belt moves (rolls in and out) smoothly in the ring-shaped space with its ends fixed to the inner and outer members.

The belt, having at least one conductor provided on or in the insulating material, is, for example, a film-shaped wire having copper foil or other materials in a film made of polyimide. When the belt rolls in and out as above, the conductor (e.g., copper foil provided in the belt) allows the relative rotation angle between the inner member and the outer member to change, and also allows electric current to be transmitted between the inner member and the outer member.

Consequently, there occurs little abrasion due to sliding motion between the belt and the outer and inner walls; hence the amount of dust is reduced. Besides, since the belt receives no strong force, there is almost no possibility that the belt cuts off. Therefore, the belt is almost maintenance free. In addition, the inner and outer members are always electrically connected to each other via the conductor in the belt. The connection includes no sliding part, and therefore has more stable and reliable electric conductivity.

Consequently, the present invention provides a rotary section current transmitting mechanism which is almost dust free, noise free, maintenance free and highly reliable.

Moreover, the conductor is fixed on or in the insulating material, and a plurality of conductors therefore can be hold easily at a predetermined interval (insulation distance). Those conductors are insulated from each other by the film-shaped insulating material made of, for example, polyimide. Consequently, the number of circuits of the current transmitted by the rotary section current transmitting mechanism can be easily increased by increasing the number of conductors in the belt.

In addition, since the mechanism has a configuration primarily utilizing the ring-shaped space around the inner member, the internal structure of the inner member is not limited: for example, the inside of the inner member may be either empty or filled. As a result, the mechanism can be easily installed around a movable section already provided in various devices.

In the arrangement, a wall insulating part made of insulating material, such as silicon rubber and polyacetal copolymer resin, is preferably adhered to a wall of the inner member and/or to a wall of the outer member which are walls facing the ring-shaped space so as to insulate the conductors in the belt from the walls. Therefore, even if the main body of the inner member or of the outer member is conductive, the conductors are prevented from being short-circuited with each other. Similarly, even if the conductors in the belt are exposed, the conductors are prevented from being short-circuited with each other, it is thus possible to prevent devices electrically connected to the conductors from being damaged.

Alternatively, in the arrangement, a wall of the inner member and/or a wall of the outer member which are walls facing the ring-shaped space preferably have electric insulating property by being coated with fluororesin (fluorocarbon polymers). Or, at least one of the walls may have electric insulating property with an anodic oxide film formed by anodic oxidation technique. In addition, after the anodic oxide film is provided on the wall(s), fluororesin may be also impregnated and/or coated on the wall(s) in order to enhance characteristics such as insulation and abrasion resistance. For example, when the inner and outer members are made of aluminum or aluminum alloy, a porous, hard and corrosion-resistive oxide film is formed first with anodic oxidation technique on the entire walls facing the ring-shaped space or a designated part of the walls. Then, the oxide film is impregnated (or, impregnated and coated) with fluororesin, such as polytetrafluoroethylene(PTFE). Such walls, having the aluminum surface provided with the hard oxide film which is impregnated (or, impregnated and coated) with fluororesin, have following useful characteristics:

(1) The walls have necessary electric insulating property and can prevent the conductors in the belt from being short-circuited with each other.

(2) The walls have excellent abrasion resistance, and the wall surfaces do not peel. In other words, the wall surfaces are smooth and thus there occurs less friction (the coefficient of friction is smaller). Therefore, the belt is more lasting and moves more smoothly. Moreover, since the surface of the aluminum composing the main body is directly processed to form the wall surface into a film, i.e., a hard oxidized-aluminum film which is impregnated (or, impregnated and coated) with fluororesin, there is little possibility that the wall surface peels while the belt is moving. Consequently, the amount of particles (dust) is better reduced.

(3) The walls are enough hard to be handled with ease and less likely to break or being damaged.

(4) The walls have good heat resistance property, which can prevent unwelcome events such as deformation and denaturation caused by heat.

Besides, the walls have good properties in corrosion resistance, precise scale workability and so on.

Moreover, in order to achieve the above object, a rotary section current transmitting mechanism in accordance with the present invention includes:

an inner member having an outer wall whose cross-sectional shape is circular;

an outer member provided around the inner member with separation from the inner member by ring-shaped space so as to form concentric circles with the inner member, and having an inner wall whose cross-sectional shape is circular; and at least one flexible conductor belt accommodated in the ring-shaped space, the conductor belt curving between both ends which are fixed in the same direction respectively to the outer wall of the inner member and to the inner wall of the outer member, wherein at least one of the inner and outer members is provided so as to be capable of rotating forward and backward within a limited angle.

According to the above arrangement, if the relative angle between the inner member and the outer member changes within a predetermined range, for example, due to rotation of the inner member in a certain direction, the conductor belt is wound around the outer wall of the inner member. If the inner member rotates in the other direction, the conductor belt is stretched along the inner wall of the outer member. The ring-shaped space between the inner member and the outer member serves during rotation in any direction as a guide for preventing the conductor belt from being rubbed or broken. Consequently, the conductor belt moves (rolls in and out) smoothly in the ring-shaped space with its ends fixed to the inner and outer members. As discussed here, the arrangement allows the relative rotation angle between the inner member and the outer member to change, and also allows electric current to be transmitted between the inner member and the outer member through the conductor belt.

Consequently, there occurs little abrasion due to sliding motion between the conductor belt and the outer and inner walls; hence the amount of dust is reduced. Besides, since the conductor belt receives no strong force, there is almost no possibility that the conductor belt cuts off. Therefore the conductor belt is almost maintenance free. In addition, the inner and outer members are always electrically connected to each other via the conductor belt. The connection includes no sliding part, and therefore has more stable and reliable electric conductivity.

Consequently, the present invention provides a rotary section current transmitting mechanism which is almost dust free, noise free, maintenance free and highly reliable.

In addition, since the mechanism has a configuration primarily utilizing the ring-shaped space around the inner member, the internal structure of the inner member is not limited: for example, the inside of the inner member may be either empty or filled. As a result, the mechanism can be easily installed around a movable section already provided in various devices.

Moreover, when a plurality of such conductor belts are provided, an insulating partition made of insulating material is preferably provided between each neighboring pair of the conductor belts. This arrangement prevents contact and provides insulation between the conductor belts. In other words, a plurality of conductor belts can be provided with such an arrangement that an insulating partition is provided between each pair of the conductor belts, and consequently, the number of circuits of the current transmitted by the rotary section current transmitting mechanism can be easily increased.

A wall insulating part made of insulating material, for example, silicon rubber and polyacetal copolymer resin is preferably adhered to a wall of the inner member and/or to a wall of the outer member which are walls facing the ring-shaped space in order to insulate the conductor belts and the walls. Consequently, even if the main body of the inner member or of the outer member is conductive, the conductor belts are prevented from being short-circuited with each other. It is thus possible to prevent devices electrically connected to the conductor belts from being damaged.

Alternatively, a wall of the inner member and/or a wall of the outer member which are walls facing the ring-shaped space preferably have electric insulating property by being coated with fluororesin (fluorocarbon polymers). Or, at least one of the walls may have electric insulating property with an anodic oxide film formed by anodic oxidation technique. In addition, after the anodic oxide film is provided on the wall(s), fluororesin may be also impregnated and/or coated on the wall(s) in order to enhance characteristics such as insulation and abrasion resistance. For example, when the inner and outer members are made of aluminum or aluminum alloy, a porous, hard and corrosion-resistive oxide film is formed first with anodic oxidation technique on the entire walls facing the ring-shaped space or a designated part of the walls. Then, the oxide film is impregnated (or, impregnated and coated) with fluororesin, such as polytetrafluoroethylene (PTFE). Such walls, having the aluminum surface provided with the hard oxide film which is impregnated (or, impregnated and coated) with fluororesin, have following useful characteristics:

(1) The walls have necessary electric insulating property and can prevent the conductor belts from being short-circuited with each other.

(2) The walls have excellent abrasion resistance, and the wall surfaces do not peel. In other words, the wall surfaces are smooth and thus there occurs less friction (the coefficient of friction is smaller). Therefore, the conductor belt is more lasting and moves more smoothly. Moreover, since the surface of the aluminum composing the main body is directly processed to form the wall surface into a film, i.e., a hard oxidized-aluminum film which is impregnated (or, impregnated and coated) with fluororesin, there is little possibility that the wall surface peels while the conductor belt is moving. Consequently, the amount of particles (dust) is better reduced.

(3) The walls are enough hard to be handled with ease and less likely to break or being damaged.

(4) The walls have good heat resistance property, which can prevent unwelcome events such as deformation and denaturation caused by heat.

Besides, the walls have good properties in corrosion resistance, precise scale workability and so on.

For a fuller understanding of the nature and advantages of the invention, reference should be made to the ensuing detailed description taken in conjunction with the accompanying drawings.

DESCRIPTION OF THE EMBODIMENTS

[FIRST EMBODIMENT]

Referring to FIGS. 1 through 7, the following description will discuss an embodiment in accordance with the present invention.

An electrostatic chuck of the present embodiment is used in an ion implantation machine in order to attract and hold, for example, a wafer. A holder surface which attracts a wafer is provided so as to rotate both forward and backward within a predetermined angle to perform operation, such as step implantation in which ion is implanted from various angles.

Figure 2:
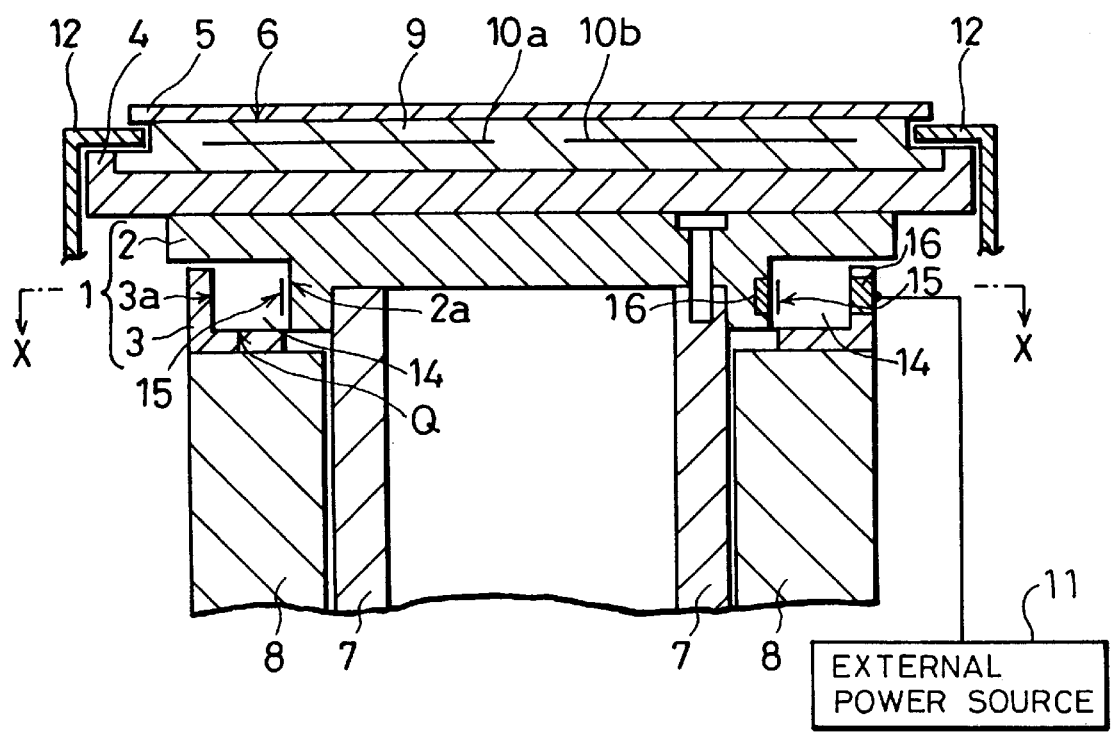
FIG. 2 is a cross-sectional view along the axis of the electrostatic chuck.

As shown in FIG. 2, the electrostatic chuck includes a rotary section current transmitting mechanism 1. The rotary section current transmitting mechanism 1 has a rotary member 2 (an inner member) which rotates, and a stationary member 3 (an outer member), and is capable of transmitting positive and negative direct currents from the stationary member 3 to the rotary member 2.

A holder base 4 of a disk shape is fixed on the upper surface of the rotary member 2. On the holder base 4, the main body 6 of the electrostatic chuck is disposed. The electrostatic chuck main body 6 (holder section), being of a disk shape, attracts and holds a substance 5, such as a wafer. The substance 5 which is attracted and held receives, for example, ion implantation treatment.

Meanwhile, the rotary member 2 is fixed at the lower surface thereof on top of a rotation shaft 7 through which driving forces are transmitted from, for example, a direct drive motor (not shown). The stationary member 3 is fixed to a stationary section supporting member 8. In the present embodiment, the rotation shaft 7 is a power output shaft of a direct drive motor, while the stationary section supporting member 8 is a stationary section of the direct drive motor.

In the present embodiment, the electrostatic chuck main body 6 is of a bipolar type, composed of a ceramics dielectric body 9 and two electrodes 10a and 10b. The electrodes 10a and 10b are of a half circle shape in its plan view, provided side by side in the dielectric body 9, and connected to the rotary section current transmitting mechanism 1 via wiring (not shown).

As a d.c. voltage of, for example, about ±350 v is applied by an external power source 11 across the electrodes 10a and 10b via the rotary section current transmitting mechanism 1, dielectric polarization occurs in the dielectric body 9 covering the electrodes 10a and 10b, thus producing electrostatic force, i.e, the attractive force. The electrostatic chuck main body 6 attracts and holds with the attractive force the substance 5 placed on the electrostatic chuck main body 6.

Claws 12 for detaching the substance 5 are disposed at the circumference of the holder surface of the electrostatic chuck main body 6. The claws 12 reciprocates in the vertical direction with a driving force from, for example, an air cylinder (not shown), thus being capable of lifting and lowering the substance 5. The substance 5 lifted by the claws 12 is transported by, for example, a transport robot.

Such an electrostatic chuck main body 6 can hold the substance 5 while preventing any material from touching the upper surface of the substance 5. Therefore, the electrostatic chuck main body 6 is useful in preventing particle adhesion to the surface of the substance 5 during, for example, ion implantation treatment.

Figure 1:
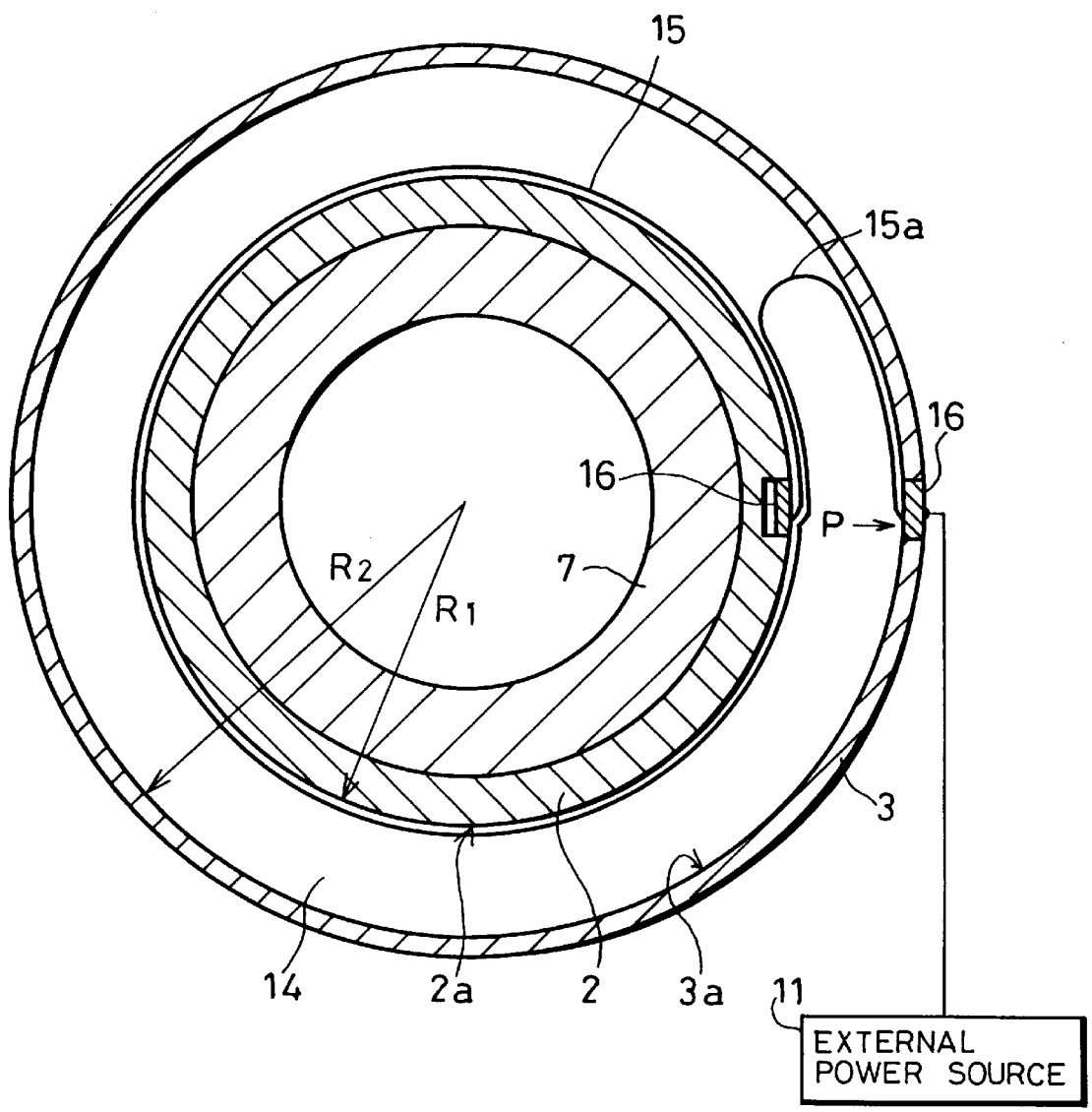
FIG. 1 is a cross-sectional view, showing an embodiment in accordance with the present invention, of a rotary section current transmitting mechanism of an electrostatic chuck of the embodiment.

Referring to FIGS. 1 and 2, the following description will discuss the rotary section current transmitting mechanism 1 in detail. FIG. 1 is a horizontal cross-sectional view at the X—X line in FIG. 2.

As shown in FIG. 1, the rotary member 2 of the rotary section current transmitting mechanism 1 is of a disk shape, and has an outer wall 2a on the lower side thereof. The outer wall 2a has a circular shape in its horizontal cross-section, and the central axis thereof is designed to agree with the central axis of the rotation shaft 7 fixed on the lower surface of the rotary member 2. The stationary member 3 is made to be of a ring shape in its plan view and of an L-like shape in its vertical cross-sectional view. An inner wall 3a of the stationary member 3 has a circular shape in its horizontal cross-section, and is disposed around the rotary member 2 so that the central axis of the inner wall 3a agrees with the central axis of the outer wall 2a of the rotary member 2. Consequently, the inner wall 3a of the stationary member 3 and the outer wall 2a of the rotary member 2 face each other, and ring-shaped space 14 is formed therebetween. In the present embodiment, the rotary member 2 and the stationary member 3 are both made of aluminum alloy.

A film-shaped thin and elastic electric wire 15 (belt) is accommodated in the ring-shaped space 14. An end of the film-shaped wire 15 is fixed to a wire fixing section 16 provided to the stationary member 3, whereas the other end is fixed to a wire fixing section 16 provided to the rotary member 2. The film-shaped wire 15 is fixed in the same direction at the wire fixing sections 16, and curves between the both ends. The curved part is shown as 15a in FIG. 1.

Figure 3:
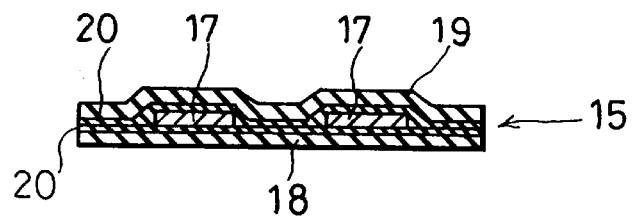
FIG. 3 is a cross-sectional view of a film-shaped wire of the rotary section current transmitting mechanism.

As shown in FIG. 3, in order to apply positive and negative d.c. voltages to the electrostatic chuck main body 6, the film-shaped wire 15 has two conductors 17 disposed side by side with a predetermined spacing therebetween. The film-shaped wire 15 has a configuration in which the two conductors 17 are sandwiched between insulating films 18 and 19 (film-shaped insulating material) serving, respectively, as a base and a cover, and the conductors 17 and the insulating films 18 and 19 are all bonded by insulating adhesive 20. Although the conductors 17 are usually made of copper foil, stainless and aluminum are sometimes used instead. The insulating films 18 and 19, made of polyimide or polyester for insulation, mechanical strength and elasticity purposes, insulate the two conductors 17 from each other, the conductors 17 from the outer wall 2a of the rotary member 2, and the conductors 17 from the inner wall 3a of the stationary member 3.

Although the width of the film-shaped wire 15 is not limited in principle, the width and the thickness of the conductors 17 are determined by the electric current to be carried by the conductors 17. The insulation distance between the conductors 17 is determined by the applied voltage and the material of the insulating films 18 and 19.

The flex breakage number, an indicator for lifetime of the film-shaped wire 15, depends upon the thickness of the film-shaped wire 15 and the radius R of the curvature of the curved part 15a of the film-shaped wire 15. More specifically, as the film-shaped wire 15 becomes thicker, the flex breakage number becomes smaller: and as the radius R of the curvature becomes shorter, the flex breakage number becomes smaller. If the film-shaped wire 15 is required to have a certain predetermined flex breakage number, the radius R of the curvature can be made shorter by making the conductors 17 and the insulating films 18 and 19 thinner. The size of the rotary section current transmitting mechanism 1 as a whole can be hence made smaller. The radius R of the curvature is given by the following equation:

$$R=(R_2-R_1)/2,$$

where, as shown in FIG. 1, $R_1$ is the radius of the outer wall 2a of the rotary member 2, and $R_2$ is the radius of the inner wall 3a of the stationary member 3.

The film-shaped wire 15 of the present embodiment has the following specifications. The insulating films 18 and 19 are made of polyimide and specified to have a thickness of 25 μm. The conductors 17 are made of rolled copper foil of 35 μm in thickness and 3 mm in width. The spacing (insulation distance) between the conductors 17 is specified to be 3 mm. This allows the film-shaped wire 15 to have a thickness of about 145 μm. In the present embodiment, the radius $R_1$ of the outer wall 2a of the rotary member 2 is specified to be 58.5 mm: the radius $R_2$ of the inner wall 3a of the stationary member 3 is specified to be 78 mm: the radius R of the curvature is specified to be 9.75 mm. An experiment have shown that these specifications result in a flex breakage number of the film-shaped wire 15 of more than $10^{10}$ times.

Figure 4:
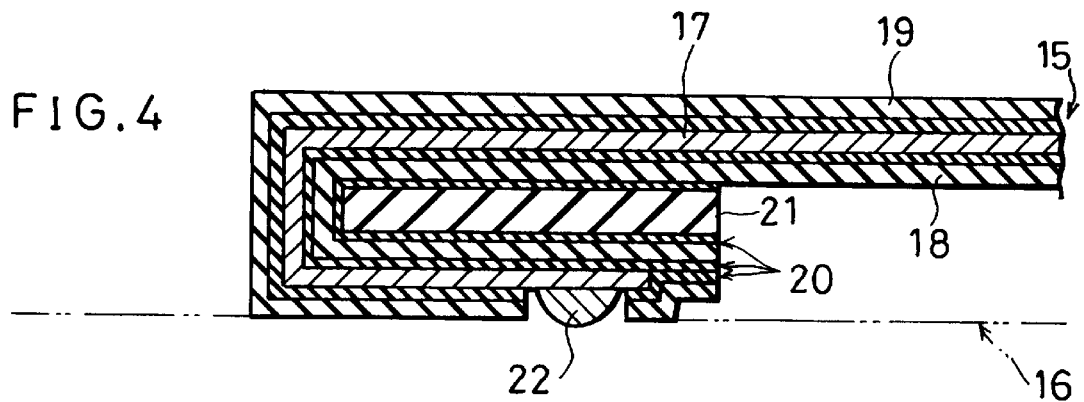
FIG. 4 is an enlarged and detailed cross-sectional view of the section P in FIG. 1, showing a wire fixing section of the film-shaped wire.

As shown in FIG. 4, an insulating reinforcing plate 21 is provided for a reinforcement purpose at each connecting part of the film-shaped wire 15 and the wire fixing sections 16. Each end part of the film-shaped wire 15 is folded parallelly to its sideline so as to sandwich the reinforcing plate 21, and fixed at the connecting part. The reinforcing plates 21 are so fixed by screws (not shown) to the wire fixing sections 16 that the conductors 17 in the film-shaped wire 15 are not affected. Each of the conductors 17 is electrically connected to a wiring (not shown) in the wire fixing section 16 via a soldered joint 22 made of, for example, solder filling a hole formed in the insulating film 19. The wiring in the wire fixing section 16 of the rotary member 2 is connected to the electrodes 10a and 10b shown in FIG. 2. The wiring between the wire fixing section 16 and the electrodes 10a and 10b is not shown. Meanwhile, the wiring in the wire fixing section 16 of the stationary member 3 is connected to the external power source 11. The wire fixing sections 16 preferably have an insulating function if the rotary member 2 and the stationary member 3 shown in FIG. 2 are made of metal.

Figure 5:
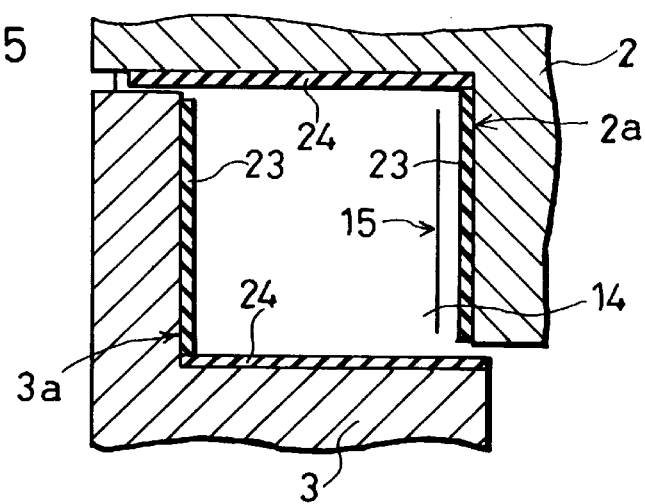
FIG. 5 is an enlarged and detailed cross-sectional view of the section Q in FIG. 2, showing walls of a rotary member and a stationary member of the rotary section current transmitting mechanism.

As shown in FIG. 5, an insulating sheet 23 is provided as a wall insulating part to the outer wall 2a of the rotary member 2 and to the inner wall 3a of the stationary member 3. The insulating sheets 23 are, for example, made of silicon rubber. An insulating plate 24 is provided as a wall insulating part to an end surface of the rotary member 2 which is the upper surface of the ring-shaped space 14 and to an end surface of the stationary member 3 which is the lower surface of the ring-shaped space 14. The insulating plates 24 are made of, for example, polyacetal copolymer resin.

Figure 6:
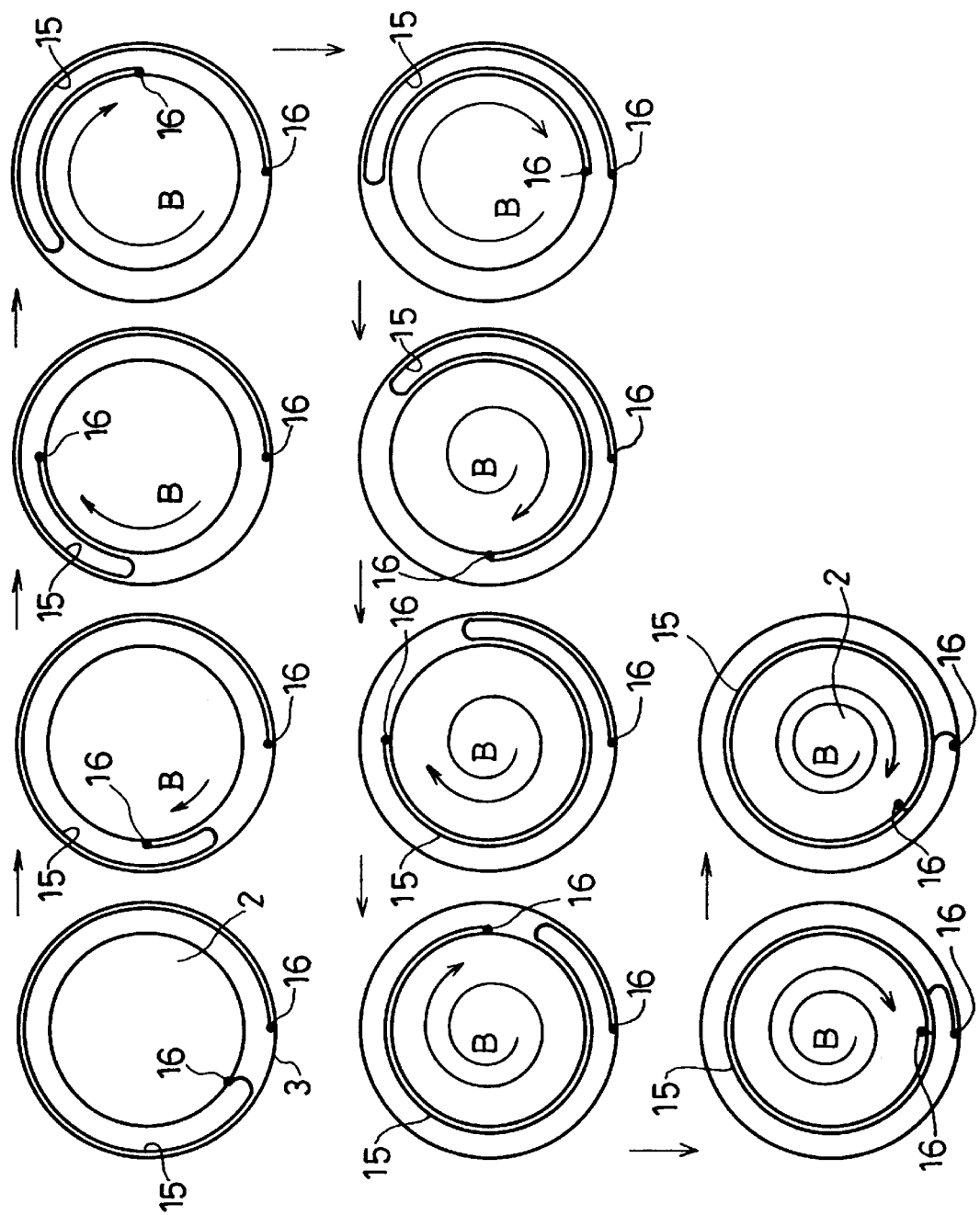
FIG. 6 is an explanatory drawing showing operation of the rotary section current transmitting mechanism.

FIG. 6 shows operation of various parts when the rotary member 2 rotates clockwise. The arrow B in FIG. 6 represents the rotation direction and rotation angle of the rotary member 2. The ring-shaped space 14 between the rotary member 2 and the stationary member 3 also serves in the rotary section current transmitting mechanism 1 as a guide for preventing the film-shaped wire 15 from being rubbed or broken. When the rotary member 2 rotates in the direction B, the film-shaped wire 15 is wound around the outer wall 2a of the rotary member 2. When the rotary member 2 rotates in the other direction (the opposite direction from the direction B), the film-shaped wire 15 is stretched along the inner wall 3a of the stationary member 3. The rotary member 2 rotating clockwise operates as shown in FIG. 6, while the rotary member 2 rotating anti-clockwise operates backwards in FIG. 6.

Note that FIGS. 1 through 7 show the film-shaped wire 15 touching neither the outer wall 2a nor the inner wall 3a. This, however, is for a better illustration of the film-shaped wire 15. The film-shaped wire 15 actually touches both the outer wall 2a and the inner wall 3a.

Figure 7:
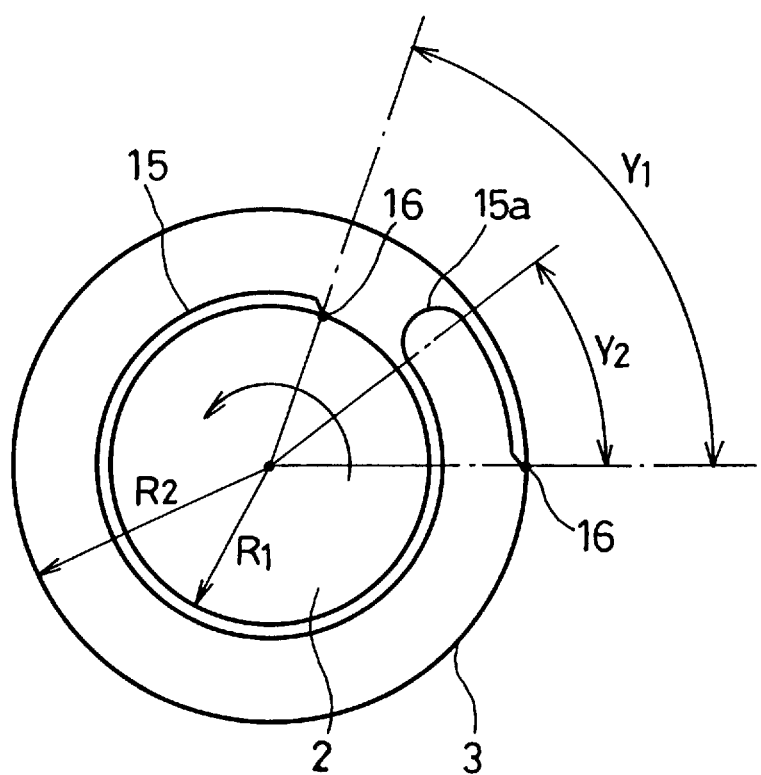
FIG. 7 is an explanatory drawing showing relationship between size and rotation angle of the rotary section current transmitting mechanism.

As shown in FIG. 7, the maximum allowable rotation angle θ [degree] depends upon factors, such as the radius $R_1$ of the outer wall 2a of the rotary member 2, the radius $R_2$ of the inner wall 3a of the stationary member 3, and the length L of the film-shaped wire 15. With the thickness of the film-shaped wire 15 ignored, the rotation angle θ is given by the following equation (1):

$$\theta = (180/\pi)(R_1+R_2)\{L-\pi(R_2-R_1)/2\}/R_1R_2 \quad (1)$$

The equation (1) is derived as explained below. As shown in FIG. 7, let $Y_1$ [rad] represent the rotation angle of the rotary member 2, and $Y_2$ [rad] represent the winding angle of the film-shaped wire 15 stretched along the stationary member 3. As already discussed, the radius R of the curvature of the curved part 15a of the film-shaped wire 15 is: $R=(R_2-R_1)/2$. Assuming that this does not change, and that the rotary member 2 is rotating as in FIG. 7, the following equations (2) and (3) hold.

$$Y_2R_2=(Y_1-Y_2)R_1 \quad (2)$$

$$Y_2=\{R_1/(R_1+R_2)\}Y_1 \quad (3)$$

The equation (3) is obtained by rearranging the equation (2).

Meanwhile, referring to FIG. 7, assuming that the rotary member 2 is in its extreme position in the anti-clockwise rotation, the following equations (4), (5) and (6) hold:

$$L_2=L-L_3=L-\pi(R_2-R_1)/2 \quad (4)$$

$$Y_2R_2=L_2 \quad (5)$$

$$Y_2=\{L-\pi(R_2-R_1)/2\}/R_2 \quad (6)$$

where $L_2$ represents the winding length of the film-shaped wire 15 stretched along the stationary member 3, $L_3$ represents the length of the curved part 15a of the film-shaped wire 15, and it is taken into consideration that $L_3=\pi(R_2-R_1)/2$.

The equation (6) is derived from the equations (4) and (5).

The equation (3) is rearranged into the equation (7) in order to give the rotation angle $Y_1$ of the rotary member 2:

$$Y_1=\{(R_1+R_2)/R_1\}Y_2 \quad (7)$$

The following equation (8) is obtained by substituting the equation (6) into the equation (7):

$$Y_1=(R_1+R_2)\{L-\pi(R_2-R_1)/2\}/R_1R_2 \quad (8)$$

The equation (1) can be obtained by changing the unit of the equation (8) (i.e, radial) into degree.

For example, in the present embodiment, the radius $R_1$ of the outer wall 2a of the rotary member 2 is specified to be 58.5 mm: the radius $R_2$ of the inner wall 3a of the stationary member 3 is specified to be 78 mm: the length L of the film-shaped wire 15 is specified to be 475 mm. Therefore, the maximum rotation angle θ obtained from the equation (1) is 761.60°.

As discussed so far, the film-shaped wire 15 moves, without slipping, on the surfaces of the outer wall 2a of the rotary member 2 and of the inner wall 3a of the stationary member 3. Consequently, there occurs little abrasion due to sliding motion between the film-shaped wire 15 and the outer and inner walls 2a and 3a; hence there occurs little dust. Besides, since the outer and inner walls 2a and 3a guide the film-shaped wire 15, the film-shaped wire 15 rolls in and out smoothly. Since the film-shaped wire 15 receives no strong force, there is almost no possibility that the film-shaped wire 15 cuts off. Consequently, the film-shaped wire 15 is lasting and almost maintenance free. In addition, the film-shaped wire 15 does not tangle, and the film-shaped wire 15 placed closer to the rotation shaft 7 allows a greater maximum allowable rotation angle than conventionally used slack wires.

In the film-shaped wire 15, the insulating films 18 and 19 relieve the tension applied to the conductors 17, and thus protect the conductors 17. In addition, since the insulating films 18 and 19 have better flex resistance than the metal composing the conductors 17, the film-shaped wire 15 hardly breaks at the curved part 15a shown in FIG. 1. Consequently, such a film-shaped wire 15 is more durable and reliable.

Moreover, since the film-shaped wire 15 seldom breaks, the radius R of the curvature of the curved part 15a of the film-shaped wire 15 can be shortened. For example, if the film-shaped wire 15 is about 145 μm in thickness as in the present embodiment, a radius of curvature of not less than approximately 10 mm provides the film-shaped wire 15 with an enough long lifetime. Consequently, it is also possible to reduce the ring-shaped space 14, and hence reduce the rotary section current transmitting mechanism 1 in size.

Meanwhile, the wire fixing sections 16 of the rotary member 2 and of the stationary member 3 are always electrically connected to each other via the conductors 17 in the film-shaped wire 15. The connection includes no sliding part, and therefore has more stable and reliable electric conductivity. For the same reason, the connection also reduces noise. Especially, since semiconductor manufacturing machines are sensitive to noise and dust, they greatly benefit from the reduction thereof.

For these reasons, the rotary member 2 can rotate both forward and backward within a limited angle, while the current can be stably transmitted between the rotary member 2 and the stationary member 3.

Therefore, as shown in FIG. 2, the external power source 11 can provide electric power to the electrostatic chuck main body 6 rotating forward and backward within the predetermined angle. The uniformity in treatment of the substance 5 can be improved, and ion can be implanted uniformly to a side-wall of a groove part formed on the substance 5, by rotating forward and backward the substance 5 attracted by the electrostatic chuck main body 6.

Furthermore, as shown in FIG. 3, the conductors 17 are sandwiched by the insulating films 18 and 19, and fixed with the insulation distance therebetween. Since the conductors 17 do not tangle and are insulated from each other, a plurality of conductors 17 are easily provided in the film-shaped wire 15. In addition, since the conductors 17 are covered with the insulating films 18 and 19, the conductors 17 are insulated from both the outer wall 2a of the rotary member 2 and the inner wall 3a of the stationary member 3.

Note that the conductors 17 may be configured with no insulating film 19 so that the conductors 17 are placed on the insulating film 18 with a suitable insulating distance between the conductors 17 and then bonded by the insulating adhesive 20. In this configuration, even if the rotary and stationary members 2 and 3 have conductivity, the conductors 17 can be prevented from being short-circuited from each other by the insulating sheets 23 and the insulating plates 24. The conductors 17 in this configuration, however, needs to be designed to have a proper thickness so as not to be damaged and/or broken.

If the number of circuits of the current transmitted by the rotary section current transmitting mechanism 1 is to be increased, the number of conductors 17 in the film-shaped wire 15 is easily increased with such a configuration that the conductors 17 are fixed on the insulating film 18, or that the conductors 17 are sandwiched between the insulating films 18 and 19 as in the present embodiment. In other words, the film-shaped wire 15 need not be increased in number in order to increase the number of circuits.

Moreover, the film-shaped wire 15 can also be configured so that a plurality of conductors 17 are provided in the thickness direction of the film-shaped wire 15. The configuration, realized by alternatively stacking an insulating film and a conductor 17, allows the number of circuits of the current transmitted by the rotary section current transmitting mechanism 1 to be increased even more.

In addition, the thickness of the conductors 17 is specified to be considerably thin in the present embodiment. The insulating films 18 and 19 are, as well as specified to be very thin, made of materials with better flexibility and flex resistance than those of metal of the same thickness. For these reasons, the film-shaped wire 15 lasts even longer.

In addition, since the mechanism has a configuration primarily utilizing the ring-shaped space 14 around the rotary member 2, the internal structure of the rotary member 2 is not limited: for example, the inside of the rotary member 2 may be either empty or filled. As a result, the mechanism can be easily installed around a movable section already provided in various devices.

Moreover, even when the conductors 17 are in an exposed state, the conductors 17 can be insulated from the rotary member 2 and the stationary member 3 by providing the insulating sheets 23 and the insulating plates 24 to the walls of the rotary member 2 and of the stationary member 3 which are walls facing the ring-shaped space 14. If the conductors 17 are in an exposed state, the exposed conductors 17 may become short-circuited and allow undesirably high current to flow, which is likely to break the rotary section current transmitting mechanism 1, the external power source 11 and/or loads connected to the rotary section current transmitting mechanism 1. The present embodiment, however, prevents such damages.

Note that in the present embodiment, the rotary member 2 and the rotation shaft 7 are two separate members: however, the rotary member 2 may also serve as the rotation shaft 7. Besides, the inside of the rotary member 2 may be either empty or filled. Furthermore, the periphery of the stationary member 3 may take any shape as long as the cross-section of its inner wall 3a is circular.

Moreover, in the rotary section current transmitting mechanism 1 of the present embodiment, the stationary member 3 provided along the outer circumference is fixed, while the rotary member 2 provided inside rotates. The rotary section current transmitting mechanism 1 may be configured so that its outer part rotates and the inner part is fixed, because the relationships between a stationary member and a rotary member are relative. The mechanism may be also configured so that neither the outer part nor the inner part is fixed.

Also note that although the rotary section current transmitting mechanism 1 is employed in an electrostatic chuck in the present embodiment, the rotary section current transmitting mechanism 1 is also suitable for other applications where a rotary section current transmitting mechanism is required for a movable section rotating forward and backward within a limited angle: for example, electricity feeding to a section rotating forward and backward in a semiconductor manufacturing machine and to an arm of an industrial robot which rotates forward and backward. The rotary section current transmitting mechanism 1 can also be employed for wiring of other purposes, apart from electricity feeding.

[SECOND EMBODIMENT]

Figure 8:
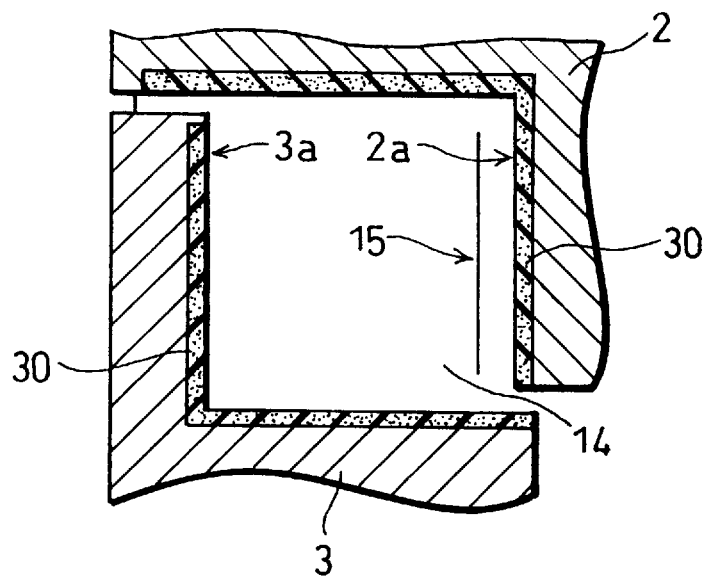
FIG. 8 is an enlarged and detailed cross-sectional view, showing another embodiment in accordance with the present invention, of walls of rotary and stationary members of a rotary section current transmitting mechanism which are walls facing a ring-shaped space in accordance with the present invention.

Referring to FIG. 8, the following description will discuss another embodiment in accordance with the present invention. Here, for convenience, members of the second embodiment that have the same arrangement and function as members of the first embodiment, and that are mentioned in the first embodiment are indicated by the same reference numerals and description thereof is omitted.

In the first embodiment, the insulating sheets 23 and the insulating plates 24 are adhered as wall insulating parts to the walls of the rotary member 2 and of the stationary member 3 which are walls facing the ring-shaped space 14. In this arrangement, however, since the insulating sheets 23 and the insulating plates 24 are adhered, they may peel when the film-shaped wire 15 moves. In other words, since the film-shaped wire 15 touches, during its movement, to the insulating sheets 23 and the insulating plates 24, the film-shaped wire 15 repeatedly comes in and goes out of contact with the insulating sheets 23 and insulating plates 24. As a result, a strong stress may cause abrasion and/or peeling. This is not preferable in terms of durability and reliability because if peeling-off of, for example, the insulating sheet 23 ever happens, it causes particles (dust) to occur in the ring-shaped space 14.

On contrast, in a rotary section current transmitting mechanism of the present embodiment, as shown in FIG. 8, the walls themselves have electric insulating property by being forming into insulating films 30, instead of adhering the insulating sheets 23 and the insulating plates 24 to the walls. The insulating film 30 is formed as explained below.

The rotary member 2 and the stationary member 3 are made of aluminum alloy as in the first embodiment. The insulating film 30 is formed on designated wall surfaces of the rotary member 2 and of the stationary member 3. The designated wall surfaces refer to either the whole wall surfaces or part of the wall surfaces facing the ring-shaped space 14. More specifically, they refer to either (1) the outer wall 2a, the inner wall 3a, an end surface of the rotary member 2 which is the upper surface of the ring-shaped space 14, and an end surface of the stationary member 3 which is the lower surface of the ring-shaped space 14, or (2) part of those walls and surfaces. In order to form the insulating film 30, a porous hard oxide film is formed first with anodic oxidation technique on the designated wall surfaces. A hard oxidized aluminum film formed in such a manner already has good corrosion resistance and electric insulating property. Nonetheless, in order to form the insulating film 30 having even better characteristics, including insulation property, the oxide film is then impregnated (or, impregnated and coated) with fluororesin, such as polytetrafluoroethylene (PTFE).

The insulating film 30, formed in the above-explained manner, has following useful characteristics:

(1) The insulating film 30 has necessary electric insulating property and can prevent the conductors 17 in the film-shaped wire 15 from being short-circuited with each other. For example, it is possible to realize a good electric insulating property with insulating resistance of $2 \times 10^{10}$ Ω and withstand voltage of 2800 V by forming the insulating film 30 having a thickness of 30 μm to 60 μm.

(2) The insulating film 30 has excellent abrasion resistance, and does not peel. The insulating surface 30 has a small coefficient of friction, or in other words, the wall where the insulating film 30 is formed is smooth. Moreover, since the insulating film 30 is an oxidized aluminum film impregnated (or, impregnated and coated) with fluororesin, there is little possibility that the insulating film 30 peels while the film-shaped wire 15 is moving. Consequently, the amount of particles (dust) is surely suppressed.

(3) The insulating film 30 is enough hard to be less likely to break or being damaged, and to be handled with ease.

(4) The insulating film 30 has good heat resistance property, and therefore does not deform or denature due to heat.

Apart from the characteristics above, the insulating film 30 has good characteristics in corrosion resistance, non-stickiness, precise scale workability and so on. Therefore, it is possible to obtain a rotary section current transmitting mechanism of high durability and reliability by forming the insulating film 30 on the designated wall surfaces of the rotary member 2 and of the stationary member 3.

As discussed above, the wall surfaces may have some electric insulating property with a hard oxide film formed by anodic oxidation technique on the designated wall surfaces of the rotary member 2 and of the stationary member 3. Alternatively, the wall surfaces may have some electric insulating property only by coating the wall surfaces with fluororesin, instead of forming the oxide film. The insulating film 30 may be formed in this manner, as long as the wall surfaces are provided with necessary characteristics, including electric insulating property. As discussed above, in the present embodiment, the insulating film 30 is formed by impregnating (or, impregnating and coating), with fluororesin, the porous hard oxide film made of aluminum with anodic oxidation technique. This is because various characteristics, such as abrasion resistance and durability in terms of peeling-off as well as the electric insulating property, are comprehensively taken into consideration in the present embodiment. The fluororesin may only impregnate the oxide film, or alternatively, the fluororesin may both impregnates and coats the oxide film. In addition, although the PTFE is used as the fluororesin in the present embodiment, other kinds of fluororesin may be also used. Moreover, even when the rotary member 2 and/or the stationary member 3 are/is not made of aluminum alloy, the insulating film 30 may be formed, so as to provide electric insulating property to the wall surfaces, by making the wall surfaces porous and then impregnating and coating the porous wall surfaces with fluororesin, or simply by coating the wall surfaces with fluororesin.

As discussed above, the insulating film 30 formed at the designated wall surfaces of the rotary member 2 and of the stationary member 3 provides the wall surfaces themselves with enough electric insulating property to prevent the conductors 17 from being short-circuited with each other, and better reduces the amount of particles (dust).

[THIRD EMBODIMENT]

Figure 9:
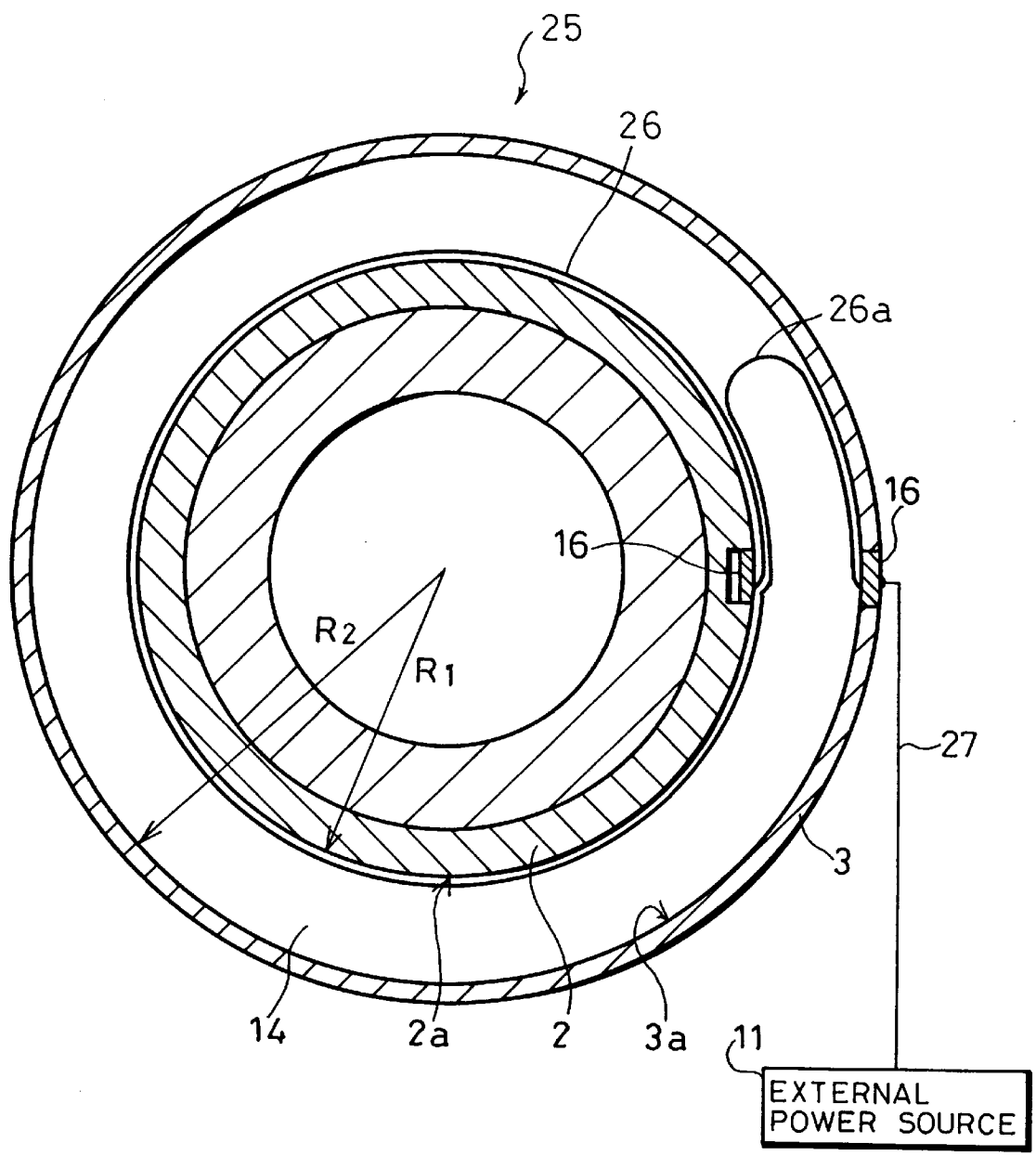
FIG. 9 is a cross-sectional view showing a rotary section current transmitting mechanism of still another embodiment in accordance with the present embodiment.
Figure 10:
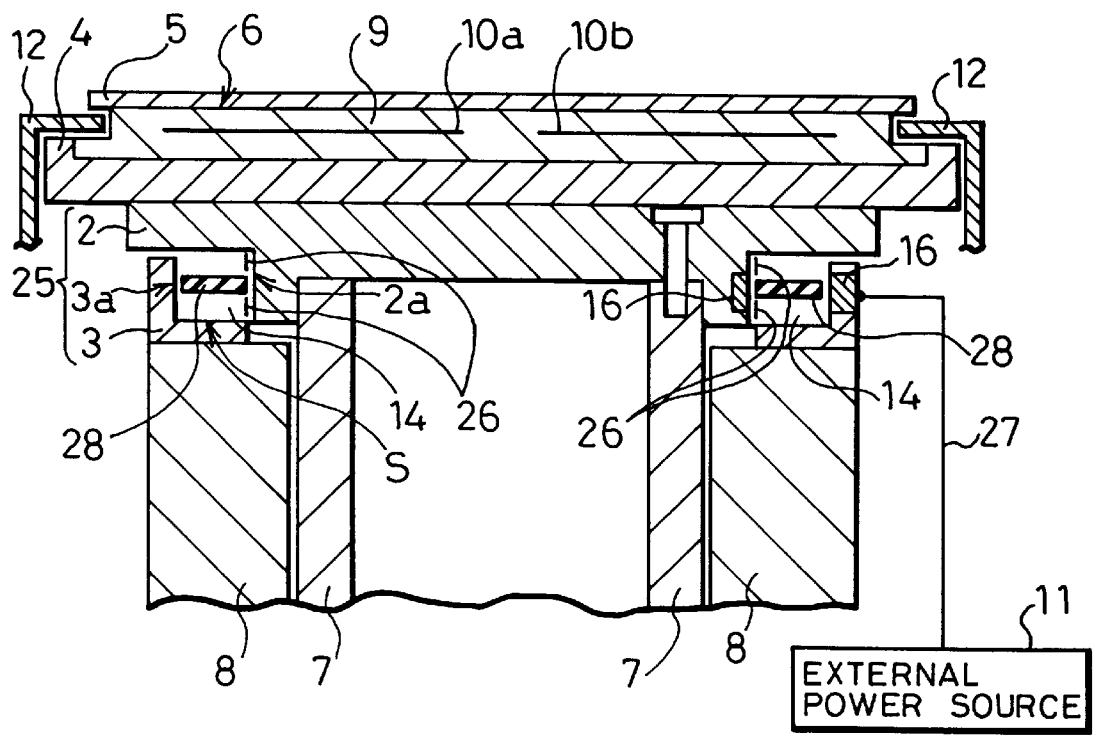
FIG. 10 is a cross-sectional view along the axis of an electrostatic chuck incorporating the rotary section current transmitting mechanism.
Figure 11:
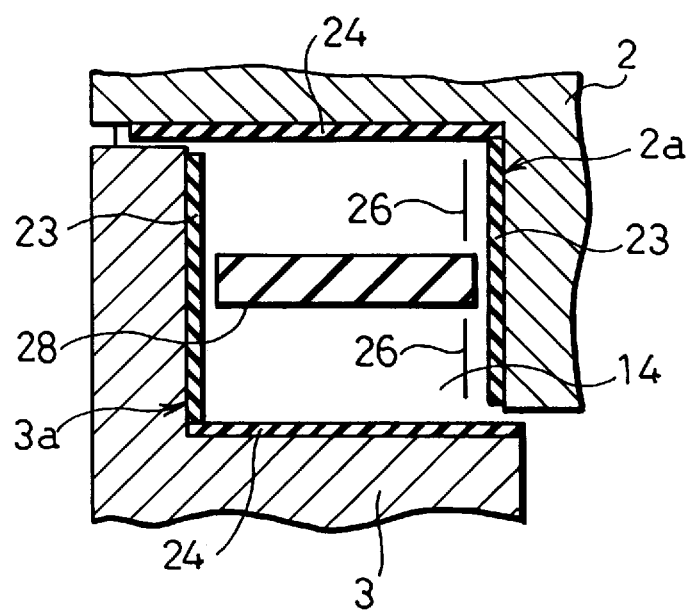
FIG. 11 is an enlarged and detailed cross-sectional view of the section S in FIG. 10.
Figure 12:
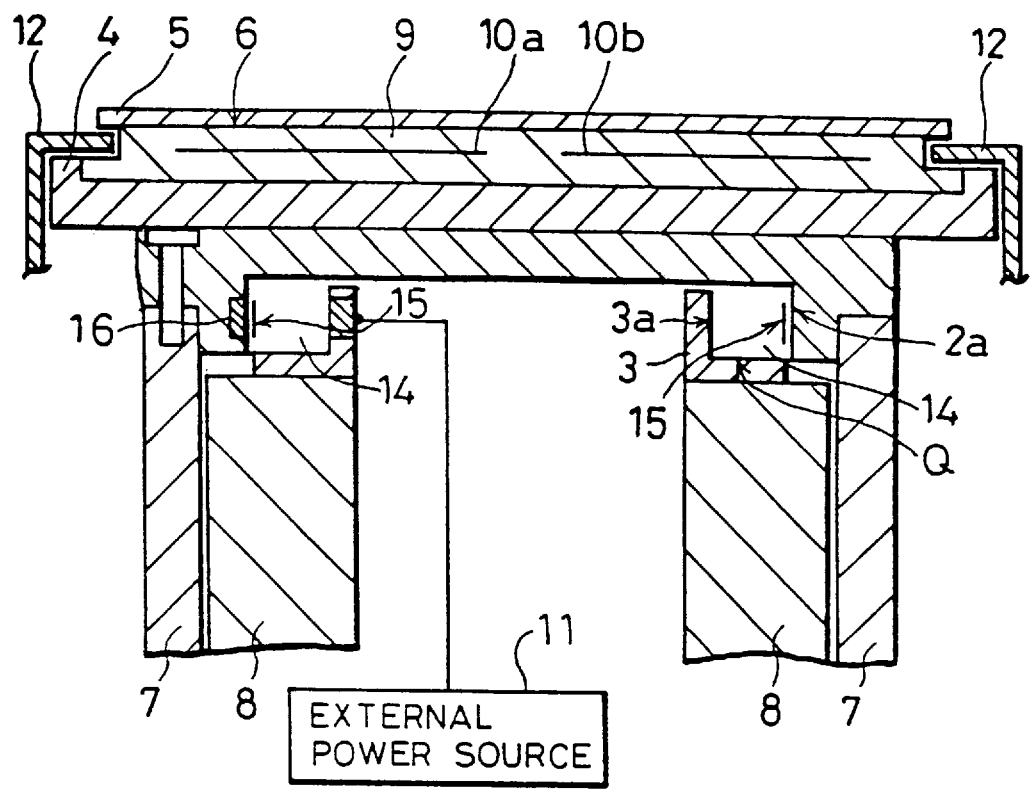
FIG. 12 is a cross-sectional view showing one example of a rotary section current transmitting mechanism in which the outer part rotates and the inner part is fixed.

Referring to FIGS. 9 through 11, the following description will discuss still another embodiment in accordance with the present invention. Here, for convenience, members of the third embodiment that have the same arrangement and function as members of the first and second embodiments, and that are mentioned in the first and second embodiments are indicated by the same reference numerals and description thereof is omitted.

As shown in FIG. 9, a rotary section current transmitting mechanism 25 of the present embodiment has the same configuration with the first and second embodiment except that the film-shaped wire 15 is replaced with a conductor belt 26.

The conductor belt 26, similarly to the film-shaped wire 15, is thin and elastic and is accommodated in the ring-shaped space 14. An end of the conductor belt 26 is fixed to a wire fixing section 16 provided to the stationary member 3, whereas the other end is fixed to a wire fixing section 16 provided to the rotary member 2. The conductor belt 26 is fixed in the same direction at the wire fixing sections 16, and curves between the both ends. The curved part is shown as 26a in FIG. 9. The conductor belt 26 can curve between the both ends because it is thin and elastic as discussed above.

The conductor belt 26, typically, is a belt made of metal such as stainless steel, copper, and steel. Other material, however, such as plastic film covered metal foil (e.g., copper foil), is also acceptable.

The width of the conductor belt 26 is not limited in principle, whereas the thickness of the conductor belt 26 is preferably not more than about 1/200 of the radius of curvature of the curved part 26a with its lifetime taken into consideration.

Similarly to the film-shaped wire 15, an end of the conductor belt 26 is connected, at the wire fixing section 16 of the stationary member 3, to a wiring 27 that carries current from the external power source 11. The other end of the conductor belt 26 is connected, at the wire fixing section 16 of the rotary member 2, to a wiring (not shown). Note that as in the first embodiment, an insulating reinforcing plate may be provided for a reinforcement purpose at each connecting part of the conductor belt 26 and the wire fixing sections 16.

In the rotary section current transmitting mechanism 25 configured as above, similarly to the rotary section current transmitting mechanism 1, the conductor belt 26 moves, without slipping, on the surfaces of the outer wall 2a of the rotary member 2 and of the inner wall 3a of the stationary member 3 during reciprocal rotation of the rotary member 2. Consequently, there occurs little abrasion due to sliding motion between the conductor belt 26 and the outer and inner walls 2a and 3a; hence there occurs little dust. Besides, since the outer and inner walls 2a and 3a guide the conductor belt 26, the conductor belt 26 rolls in and out smoothly. Since the conductor belt 26 receives no strong force, there is almost no possibility that the conductor belt 26 cuts off. Consequently, the conductor belt 26 is lasting and almost maintenance free.

Meanwhile, the wire fixing sections 16 of the rotary member 2 and of the stationary member 3 are always electrically connected to each other via the conductor belt 26. The connection includes no sliding part, and therefore has more stable and reliable electric conductivity. For the same reason, the connection also reduces noise. Especially, since semiconductor manufacturing machines are sensitive to noise and dust, they greatly benefit from the reduction thereof.

For these reasons, the rotary member 2 can rotate both forward and backward within a limited angle, while the current can be stably transmitted between the rotary member 2 and the stationary member 3 through the conductor belt 26. In addition, a great maximum allowable rotation angle of the rotary member 2 can be set. Besides, since the mechanism has a configuration primarily utilizing the ring-shaped space 14 around the rotary member 2, the internal structure of the rotary member 2 is not limited: for example, the inside of the rotary member 2 may be either empty or filled. As a result, the mechanism can be easily installed around a movable section already provided in various devices.

FIG. 10 shows an example of the rotary section current transmitting mechanism 25 incorporated, similarly to the first and second embodiment, in an electrostatic chuck. In this example, two conductor belts 26 are provided in the ring-shaped space 14 side by side in the vertical direction. The conductor belts 26 are connected, at the wire fixing section 16 of the rotary member 2, to a wiring to electrodes 10a and 10b of the electrostatic chuck main body 6, and connected, at the wire fixing section 16 of the stationary member 3, to the wiring 27 from the external power source 11. The wiring between the electrodes 10a and 10b and the wire fixing section 16 of the rotary member 2 is not shown.

A ring-shaped insulating partition 28 made of insulating material such as polyacetal resin is provided between the two conductor belts 26 so as to electrically insulate the two conductors belts 26 from each other. Similarly, when a plurality of conductor belts 26 are provided, the ring-shaped space 14 needs to be so divided according to the number of the conductor belts 26 that each of the divided spaces can accommodate one conductor belt 26. In other words, a plurality of conductor belts 26 can be provided with such a configuration that an insulating partition 28 is provided between each neighboring pair of the conductor belts 26. Accordingly, the number of circuits of the current transmitted by the rotary section current transmitting mechanism 25 can be easily increased.

In addition, the rotary member 2 and the stationary member 3 in this example are both made of aluminum alloy. As shown in FIG. 11, insulating sheets 23 and insulating plates 24 are provided so as to ensure insulation between the rotary member 2, the stationary member 3 and the conductor belts 26. More specifically, an insulating sheet 23 is provided as a wall insulating part to the outer wall 2a of the rotary member 2 and to the inner wall 3a of the stationary member 3, whereas an insulating plate 24 is provided as a wall insulating part to an end surface of the rotary member 2 which is the upper surface of the ring-shaped space 14 and to an end surface of the stationary member 3 which is the lower surface of the ring-shaped space 14. The insulating sheets 23 are, for example, made of silicon rubber, and the insulating plates 24 are made of, for example, polyacetal copolymer resin.

Alternatively, as in the second embodiment, it is needless to say that the wall surfaces themselves may be provided with electric insulating property by forming designated parts of the wall surfaces of the rotary and stationary members 2 and 3 into the insulating films 30. This arrangement is more preferable because it better reduces the amount of particles (dust).

The two conductor belts 26, made of SUS 301 (strong stainless steel obtained by work hardening with cold work) in this example, are metal belts which are 6 mm in width and 0.05 mm in thickness. The surfaces of the metal belt are coated with fluorine contained resin to reduce dust more effectively and to provide more stable insulation.

Also in this example, the radius $R_1$ of the outer wall 2a of the rotary member 2 is specified to be 56.5 mm: the radius $R_2$ of the inner wall 3a of the stationary member 3 is specified to be 75 mm: and the length L of the conductor belt 26 is specified to be 440 mm. Therefore, the maximum allowable rotation angle θ obtained from the equation (1) discussed in the first embodiment is 730°. Besides, the radius of curvature of the curved part 26a of the conductor belt 26 is 9.25 mm. The thickness of the conductor belt 26 is preferably not more than about 1/200 (i.e., 0.046 mm) of the radius of curvature as discussed above. The thickness in this example is therefore specified to be 0.05 mm, which is the possible closest value to the ideal value.

Similarly to the first and second embodiment, in the electrostatic chuck incorporating the rotary section current transmitting mechanism 25, the electrostatic chuck main body 6 can be rotated forward and backward by the rotary member 2. Besides, positive and negative d.c. voltages can be applied through the rotary section current transmitting mechanism 25 from the stationary member 3 side to the electrostatic chuck main body 6 rotating forward and backward. Moreover, the rotary section current transmitting mechanism 25 achieves the effects discussed above.

Note that in the rotary section current transmitting mechanism 25 of the present embodiment, the stationary member 3 provided on the outer circumference is fixed, while the rotary member 2 provided inside rotates. The rotary section current transmitting mechanism 25 may, however, be configured so that its outer part rotates and the inner part is fixed, because the relationships between a stationary member and a rotary member are relative. The mechanism may be also configured so that neither the outer part nor the inner part is fixed.

The invention being thus described, it will be obvious that the same may be varied in many ways. Such variations are not to be regarded as a departure from the spirit and scope of the invention, and all such modifications as would be obvious to one skilled in the art intended to be include within the scope of the following claims.

What is claimed is:

1. A rotary section current transmitting mechanism, comprises:

an inner member having an outer wall whose cross-sectional shape is circular;

an outer member provided around said inner member with separation from said inner member by ring-shaped space so as to form concentric circles with said inner member, and having an inner wall whose cross-sectional shape is circular; and a flexible belt accommodated in the ring-shaped space, ends of said belt being fixed respectively to the outer wall of said inner member and to the inner wall of said outer member so as to extend in the same direction through the ring-shaped space, a curved part of said belt existing between said ends, wherein at least one of said inner and outer members is provided so as to be capable of rotating forward and backward within a limited angle, and said belt has at least one conductor provided on a film-shaped insulating material that serves as a base, and further wherein a wall insulating part made of insulating material is provided on a wall of said inner member and/or on a wall of said outer member which are walls facing the ring-shaped space.

2. The rotary section current transmitting mechanism as defined in claim 1, wherein said inner member is provided so as to be capable of rotating forward and backward within a limited angle, and said outer member is fixed.

3. The rotary section current transmitting mechanism as defined in claim 1, wherein said outer member is provided so as to be capable of rotating forward and backward within a limited angle, and said inner member is fixed.

4. The rotary section current transmitting mechanism as defined in claim 1, wherein, where at least one of said ends of said belt is fixed to the inner or outer wall, said belt is folded so that side edges of said belt remain parallel, the folded portion of said belt being affixed to a wire fixing section provided on the wall.

5. The rotary section current transmitting mechanism as defined in claim 4, further comprising a reinforcing plate fixed to the wiring fixing section, wherein the fold in said belt sandwiches said reinforcing plate.

6. The rotary section current transmitting mechanism as defined in claim 1, wherein the ring-shaped space contains said belt and is otherwise empty.

7. A rotary section current transmitting mechanism, comprises:
   an inner member having an outer wall whose cross-sectional shape is circular;
   an outer member provided around said inner member with separation from said inner member by ring-shaped space so as to form concentric circles with said inner member, and having an inner wall whose cross-sectional shape is circular; and
   a flexible belt accommodated in the ring-shaped space, ends of said belt being fixed respectively to a fixing location on the outer wall of said inner member and to a fixing location on the inner wall of said outer member so as to extend in the same direction from the fixing locations, a curved part of said belt existing between said ends,
   wherein at least one of said inner and outer members is provided so as to be capable of rotating forward and backward within a limited angle, and said belt has at least one conductor provided in a film-shaped insulating material, and
   further wherein a wall insulating part made of insulating material is provided on a wall of said inner member and/or on a wall of said outer member which are walls facing the ring-shaped space.

8. The rotary section current transmitting mechanism as defined in claim 7,
   wherein said inner member is provided so as to be capable of rotating forward and backward within a limited angle, and said outer member is fixed.

9. The rotary section current transmitting mechanism as defined in claim 7,
   wherein said outer member is provided so as to be capable of rotating forward and backward within a limited angle, and said inner member is fixed.

10. The rotary section current transmitting mechanism as defined in claim 7,
    wherein the conductor is made of copper foil.

11. The rotary section current transmitting mechanism as defined in claim 7,
    wherein the film-shaped insulating material is made of polyimide.

12. The rotary section current transmitting mechanism as defined in claim 7,
    wherein the wall insulating part is made of silicon rubber or polyacetal copolymer resin.

13. The rotary section current transmitting mechanism as defined in claim 7, wherein, at at least one of the fixing locations, said belt is folded so that side edges of said belt remain parallel, the folded portion of said belt being affixed to the fixing location.

14. The rotary section current transmitting mechanism as defined in claim 13, further comprising a reinforcing plate fixed to the fixing location, wherein the fold in said belt sandwiches said reinforcing plate.

15. The rotary section current transmitting mechanism as defined in claim 7, wherein the ring-shaped space contains said belt and is otherwise empty.

16. A rotary section current transmitting mechanism, comprises:
    an inner member having an outer wall whose cross-sectional shape is circular;
    an outer member provided around said inner member with separation from said inner member by ring-shaped space so as to form concentric circles with said inner member, and having an inner wall whose cross-sectional shape is circular; and
    a flexible belt accommodated in the ring-shaped space, ends of said belt being fixed respectively to a fixing location on the outer wall of said inner member and to a fixing location on the inner wall of said outer member so as to extend in the same direction from the fixing locations, a curved part of said belt existing between said ends,
    wherein at least one of said inner and outer members is provided so as to be capable of rotating forward and backward within a limited angle, and said belt has at least one conductor provided in a film-shaped insulating material, and
    further wherein a wall surface of said inner member and/or a wall surface of said outer member which are a whole or part of wall surfaces facing the ring-shaped space have/has electric insulating property.

17. The rotary section current transmitting mechanism as defined in claim 16,
    wherein the wall is electrically conductive material which is treated in order to form the wall surface, such that the wall surface is an insulating film on the wall, and the insulating film is either a hard anodic oxide film, a fluororesin-coated film, or a hard anodic oxide film impregnated and/or coated with fluororesin.

18. The rotary section current transmitting mechanism as defined in claim 17,
    wherein at least parts of said inner and outer members which are in the neighborhood of the ring-shaped space are made of aluminum or aluminum alloy, and the insulating film is a hard anodic oxidized-aluminum film impregnated and/or coated with the fluororesin.

19. The rotary section current transmitting mechanism as defined in claim 18,
    wherein the fluororesin is polytetrafluoroethylene (PTFE).

20. The rotary section current transmitting mechanism as defined in claim 16, wherein the wall surface having electric insulating property is an oxidized region of the wall.

21. The rotary section current transmitting mechanism as defined in claim 17, wherein the wall is oxidized in order to form the wall surface.

22. A rotary section current transmitting mechanism, comprises:
    an inner member having an outer wall whose cross-sectional shape is circular;
    an outer member provided around said inner member with separation from said inner member by ring-shaped space so as to form concentric circles with said inner member, and having an inner wall whose cross-sectional shape is circular; and
    at least one flexible conductor belt accommodated in the ring-shaped space, said conductor belt having conductive material exposed on its outer surface, ends of said belt being fixed respectively to the outer wall of said inner member and to the inner wall of said outer member so as to extend in the same direction through the ring-shaped space, a curved part of said belt existing between said ends, wherein at least one of said inner and outer members is provided so as to be capable of rotating forward and backward within a limited angle, and further wherein a wall insulating part made of insulating material is provided on a wall of said inner member and/or on a wall of said outer member which are walls facing the ring-shaped space.

23. The rotary section current transmitting mechanism as defined in claim 22, wherein a plurality of said conductor belts are provided, and an insulating partition made of insulating material is provided between each neighboring pair of said conductor belts.

24. The rotary section current transmitting mechanism as defined in claim 22, wherein said inner member is provided so as to be capable of rotating forward and backward within a limited angle, and said outer member is fixed.

25. The rotary section current transmitting mechanism as defined in claim 22, wherein said outer member is provided so as to be capable of rotating forward and backward within a limited angle, and said inner member is fixed.

26. The rotary section current transmitting mechanism as defined in claim 22, wherein the wall insulating part is made of silicon rubber or polyacetal copolymer resin.

27. The rotary section current transmitting mechanism as defined in claim 22, wherein, where at least one of said ends of said belt is fixed to the inner or outer wall, said belt is folded so that side edges of said belt remain parallel, the folded portion of said belt being affixed to a wire fixing section provided on the wall.

28. The rotary section current transmitting mechanism as defined in claim 27, further comprising a reinforcing plate fixed to the wiring fixing section, wherein the fold in said belt sandwiches said reinforcing plate.

29. The rotary section current transmitting mechanism as defined in claim 22, wherein the ring-shaped space contains said belt and is otherwise empty.

30. A rotary section current transmitting mechanism, comprises:

an inner member having an outer wall whose cross-sectional shape is circular;

an outer member provided around said inner member with separation from said inner member by ring-shaped space so as to form concentric circles with said inner member, and having an inner wall whose cross-sectional shape is circular; and at least one flexible conductor belt accommodated in the ring-shaped space, said conductor belt having conductive material exposed on its outer surface, ends of said belt being fixed respectively to the outer wall of said inner member and to the inner wall of said outer member so as to extend in the same direction through the ring-shaped space, a curved part of said belt existing between said ends, wherein at least one of said inner and outer members is provided so as to be capable of rotating forward and backward within a limited angle, and further wherein a wall surface of said inner member and/or a wall surface of said outer member which are a whole or part of wall surfaces facing the ring-shaped space have/has electric insulating property.

31. The rotary section current transmitting mechanism as defined in claim 30, wherein the wall surface is made of an insulating film, and the insulating film is either a hard anodic oxide film, a fluororesin-coated film, or a hard anodic oxide film impregnated and/or coated with fluororesin.

32. The rotary section current transmitting mechanism as defined in claim 31, wherein at least parts of said inner and outer members which are in the neighborhood of the ring-shaped space are made of aluminum or aluminum alloy, and the insulating film is a hard anodic oxidized-aluminum film impregnated and/or coated with the fluororesin.

33. The rotary section current transmitting mechanism as defined in claim 32, wherein the fluororesin is polytetrafluoroethylene (PTFE).

34. The rotary section current transmitting mechanism as defined in claim 30, wherein, at at least one of the fixing locations, said belt is folded so that side edges of said belt remain parallel, the folded portion of said belt being affixed to the fixing location.

35. The rotary section current transmitting mechanism as defined in claim 34, further comprising a reinforcing plate fixed to the fixing location, wherein the fold in said belt sandwiches said reinforcing plate.

36. The rotary section current transmitting mechanism as defined in claim 30, wherein the ring-shaped space contains said belt and is otherwise empty.

37. An electrostatic chuck, comprising:

a holder section, having at least two electrodes, for attracting and holding a substance placed on a surface with an electrostatic force produced by voltage applied across the electrodes; and a rotary section current transmitting mechanism for transmitting electric current to the electrodes, wherein said rotary section current transmitting mechanism includes:

a rotary member connected directly or indirectly to said holder section, having an outer wall whose cross-sectional shape is circular, and rotating forward and backward within a limited angle;

a stationary member provided around the rotary member with separation from the rotary member by ring-shaped space so as to form concentric circles with the rotary member, and having an inner wall whose cross-sectional shape is circular; and a flexible belt accommodated in the ring-shaped space, said belt curving between both ends which are fixed in the same direction respectively to the outer wall of the rotary member and to the inner wall of the stationary member, wherein said belt has at least one conductor provided in a film-shaped insulating material.

38. The electrostatic chuck as defined in claim 37, wherein a wall insulating part made of insulating material is provided on a wall of the rotary member and/or on a wall of the stationary member which are walls facing the ring-shaped space.

39. The electrostatic chuck as defined in claim 37, wherein a wall surface of said rotary member and/or a wall surface of said stationary member which are a whole or part of wall surfaces facing the ring-shaped space have/has electric insulating property.

40. The electrostatic chuck as defined in claim 37, wherein the conductor is made of copper foil.

41. The electrostatic chuck as defined in claim 37, wherein the film-shaped insulating material is made of polyimide.

42. The electrostatic chuck as defined in claim 38, wherein the wall insulating part is made of silicon rubber or polyacetal copolymer resin.

43. The electrostatic chuck as defined in claim 39, wherein the wall surface is made of an insulating film, and the insulating film is either a hard anodic oxide film, a fluororesin-coated film, or a hard anodic oxide film impregnated and/or coated with fluororesin.

44. The electrostatic chuck as defined in claim 43, wherein at least parts of said rotary and stationary members which are in the neighborhood of the ring-shaped space are made of aluminum or aluminum alloy, and the insulating film is a hard anodic oxidized-aluminum film impregnated and/or coated with the fluororesin.

45. The electrostatic chuck as defined in claim 44, wherein the fluororesin is polytetrafluoroethylene (PTFE).

46. The electrostatic chuck as defined in claim 39, wherein the wall surface having electric insulating property is an oxidized region of the wall.

47. The electrostatic chuck as defined in claim 37, wherein the ring-shaped space contains said belt and is otherwise empty.

48. An electrostatic chuck, comprising:

a holder section, having at least two electrodes, for attracting and holding a substance placed on a surface with an electrostatic force produced by voltage applied across the electrodes; and a rotary section current transmitting mechanism for transmitting electric current to the electrodes, wherein said rotary section current transmitting mechanism includes:

a rotary member connected directly or indirectly to said holder section, having an outer wall whose cross-sectional shape is circular, and rotating forward and backward within a limited angle;

a stationary member provided around the rotary member with separation from the rotary member by ring-shaped space so as to form concentric circles with the rotary member, and having an inner wall whose cross-sectional shape is circular; and at least one flexible conductor belt accommodated in the ring-shaped space, said conductor belt having conductive material exposed on its outer surface over the length of said belt, ends of said belt being fixed respectively to a fixing location on the outer wall of the rotary member and to a fixing location on the inner wall of the stationary member.

49. The electrostatic chuck as defined in claim 48, wherein a wall insulating part made of insulating material is provided on a wall of the rotary member and/or on a wall of the stationary member which are walls facing the ring-shaped space.

50. The electrostatic chuck as defined in claim 48, wherein a wall surface of said rotary member and/or a wall surface of said stationary member which are a whole or part of wall surfaces facing the ring-shaped space have/has electric insulating property.

51. The electrostatic chuck as defined in claim 48, wherein a plurality of said conductor belts are provided, and an insulating partition made of insulating material is provided between each neighboring pair of said conductor belts.

52. The electrostatic chuck as defined in claim 49, wherein the wall insulating part is made of silicon rubber or polyacetal copolymer resin.

53. The electrostatic chuck as defined in claim 50, wherein the wall is electrically conductive material which is treated in order to form the wall surface, such that the wall surface is an insulating film on the wall, and the insulating film is either a hard anodic oxide film, a fluororesin-coated film, or a hard anodic oxide film impregnated and/or coated with fluororesin.

54. The electrostatic chuck as defined in claim 53, wherein at least parts of said rotary and stationary members which are in the neighborhood of the ring-shaped space are made of aluminum or aluminum alloy, and the insulating film is a hard anodic oxidized-aluminum film impregnated and/or coated with the fluororesin.

55. The electrostatic chuck as defined in claim 54, wherein the fluororesin is polytetrafluoroethylene (PTFE).

56. The electrostatic chuck as defined in claim 48, wherein the ring-shaped space contains said belt and is otherwise empty.

57. The electrostatic chuck as defined in claim 50, wherein the wall surface having electric insulating property is an oxidized region of the wall.

58. The electrostatic chuck as defined in claim 53, wherein the wall is oxidized in order to form the wall surface.

* * * * *